(12) United States Patent
Lin et al.

(10) Patent No.: US 6,343,020 B1
(45) Date of Patent: Jan. 29, 2002

(54) MEMORY MODULE

(75) Inventors: Pao-Lung Lin, Taipei; Nien-Tien Cheng, Tao-Yuan; Heng-Chih Liu, Taipei, all of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/356,481

(22) Filed: Jul. 19, 1999

(30) Foreign Application Priority Data

Dec. 28, 1998 (TW) .......................................... 87221626

(51) Int. Cl.$^7$ ................................................ H05K 9/00
(52) U.S. Cl. ....................... 361/816; 361/818; 361/753; 361/794; 439/609; 439/610
(58) Field of Search ................................ 361/816, 818, 361/684, 715, 794, 728, 801, 736, 704, 799, 753; 174/35 R, 50 G, 50 R; 439/607, 608, 609, 610

(56) References Cited

U.S. PATENT DOCUMENTS

| | | | | |
|---|---|---|---|---|
| 4,441,140 A | * | 4/1984 | Richard ....................... 361/386 |
| 5,007,862 A | * | 4/1991 | Defibaugh et al. .......... 439/607 |
| 5,023,754 A | * | 6/1991 | Aug et al. .................... 361/415 |
| 5,037,330 A | * | 8/1991 | Fulponi et al. ............. 439/607 |
| 5,268,815 A | * | 12/1993 | Cipolla et al. .............. 361/704 |
| 5,659,459 A | * | 8/1997 | Wakabayashi et al. ...... 361/753 |
| 5,661,339 A | * | 8/1997 | Clayton ....................... 257/678 |
| 5,731,964 A | * | 3/1998 | Kitakubo et al. ........... 361/816 |
| 5,777,856 A | * | 7/1998 | Phillips et al. ............... 257/678 |
| 5,847,938 A | * | 12/1998 | Gammon ..................... 361/816 |
| 5,856,910 A | * | 6/1999 | Yurchenco et al. ......... 361/704 |

OTHER PUBLICATIONS

Kingston technology module specification for direct rambus RIMM Module assembly (Dec. 16, 1999).*

* cited by examiner

Primary Examiner—Jeffrey Gaffin
Assistant Examiner—Hung Bui
(74) Attorney, Agent, or Firm—Wei Te Chung

(57) ABSTRACT

A memory module includes a circuit board on which memory chips are mounted and a metal casing attached to the circuit board for shielding the memory chips. Conductive traces are formed on the circuit board for electrically engaging corresponding portions of the casing to ground the casing. The casing forms a raised portion defining a space for accommodating the memory chips. A recess is formed on the raised portion and a bottom surface of the recess contacts the memory chips to conduct and remove heat from the memory chips. Ventilation holes are defined in the raised portion for facilitating heat removal. The casing forms two positioning pins inserted into corresponding positioning holes defined in the circuit board for properly positioning the casing with respect to the circuit board. The casing also forms two latching arms engaging with corresponding latching holes defined in the circuit board for securing the casing to the circuit board.

13 Claims, 3 Drawing Sheets

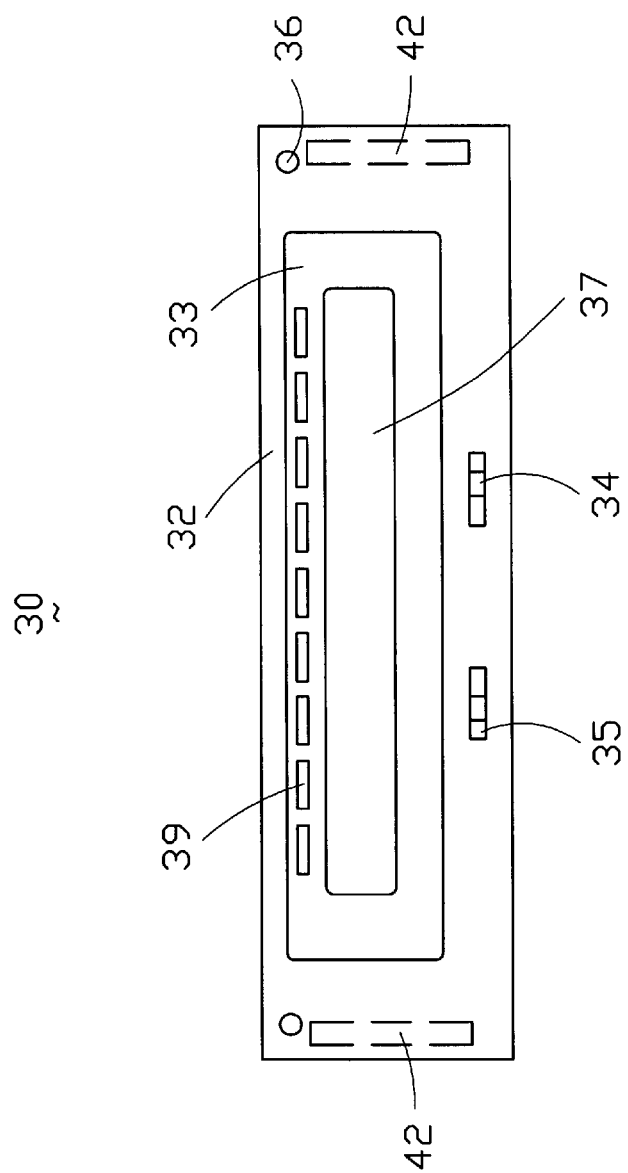
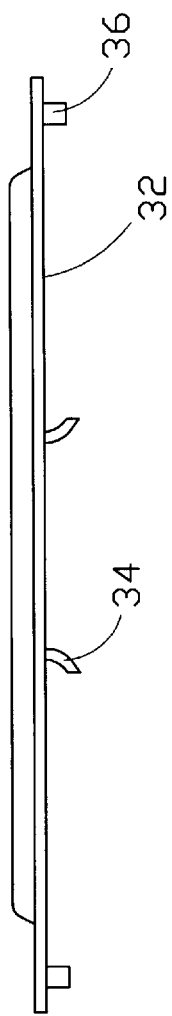

MEMORY MODULE

BACKGROUND OF THE INVENTION

1. Field of the Invention

The present invention generally relates to a memory module, and in particular to a RAM bus module.

2. The Prior Art

As capabilities of a computer become significantly enhanced, memory capacity for the computer increases. Memory modules, such as a dual in-line memory module (DIMM) comprising a circuit board with a number of memory chips mounted thereon, are commonly employed in a personal computer. The DIMM device is usually connected to a main computer board by means of a card edge connector. The card edge connector forms a slot which receives an edge of a circuit board of the DIMM. Contacts are arranged in the slot for electrically engaging with conductive traces of the DIMM circuit board thereby forming electrical connection therebetween.

As speed and capacity of the DIMM device increase, protecting the DIMM device from external electromagnetic interference and properly removing heat from the memory chips thereof become serious issues to be addressed. It is thus desired to have a memory module which eliminates these problems.

SUMMARY OF THE INVENTION

Accordingly, an object of the present invention is to provide a memory module protected from external electromagnetic interference by a shielding member.

Another object of the present invention is to provide a memory module capable of removing heat generated by memory chips thereof during operation.

To achieve the above objects, a memory module in accordance with the present invention comprises a circuit board on which memory chips are mounted and a metal casing attached to the circuit board for shielding the memory chips. Conductive traces are formed on the circuit board for electrically engaging corresponding portions of the casing to ground the casing. The casing forms a raised portion defining a space for accommodating the memory chips. A recess is formed on the raised portion and a bottom surface thereof contacts the memory chip to conduct and remove heat from the memory chips. Ventilation holes are defined in the raised portion for facilitating heat removal. The casing forms two positioning pins inserted into corresponding positioning holes defined in the circuit board for properly positioning the casing with respect to the circuit board. The casing also forms two latching arms engaging corresponding latching holes defined in the circuit board for securing the casing to the circuit board.

BRIEF DESCRIPTION OF THE DRAWINGS

The present invention will be apparent to those skilled in the art by reading the following description of a preferred embodiment thereof, with reference to the accompanying drawings, in which:

FIG. 2A is a rear view of a casing of the memory module;

FIG. 2B is a side view of the casing of the memory module; and

DETAILED DESCRIPTION OF THE PREFERRED EMBODIMENT

Figure 1:
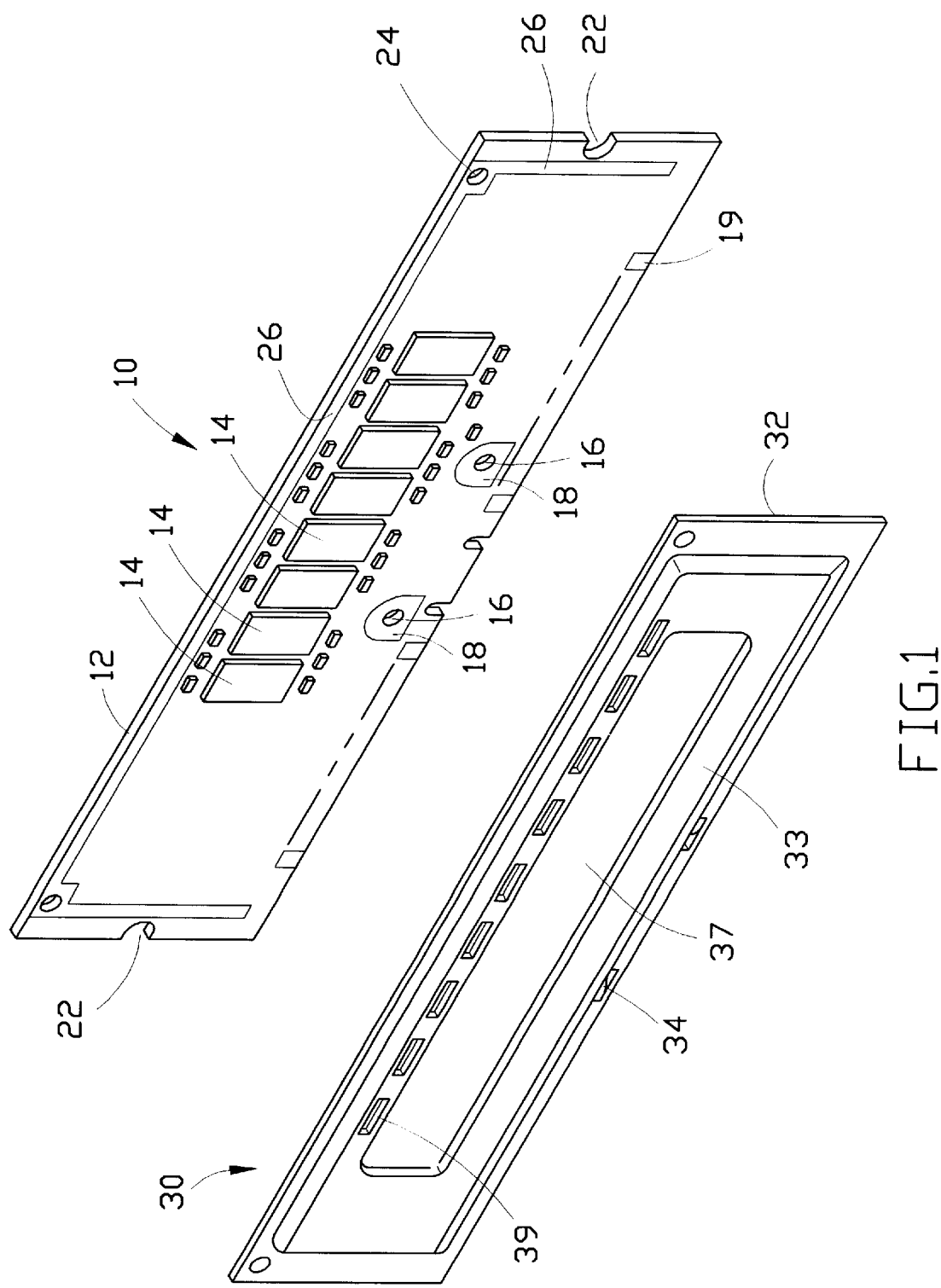
FIG. 1 is an exploded view of a memory module of the present invention.

Referring to the drawings and in particular to FIG. 1, a memory module in accordance with the present invention comprises a memory card 10 and a shielding casing 30. The memory module may be a RAM bus module. The memory card 10 comprises a circuit board 12 having a face on which a number of memory chips 14 and related electronic elements (not labeled) are mounted. The circuit board 12 defines two latching holes 16 and two positioning holes 24 distanced from the latching holes 16. A conductive pad 18 is formed on the circuit board 12 around each latching hole 16 serving as first grounding members. A U-shaped conductive trace 26 is also formed on the circuit board 12 substantially surrounding the memory chips 14 for serving as a second grounding member. A plurality of external contacts 19 is formed on the circuit board 12 for electrically engaging with a card edge connector (not shown). A pair of notches 22 is formed in opposite edges of the circuit board 12 for mechanically engaging with the card edge connector to retain the memory module in the connector.

Figure 3:
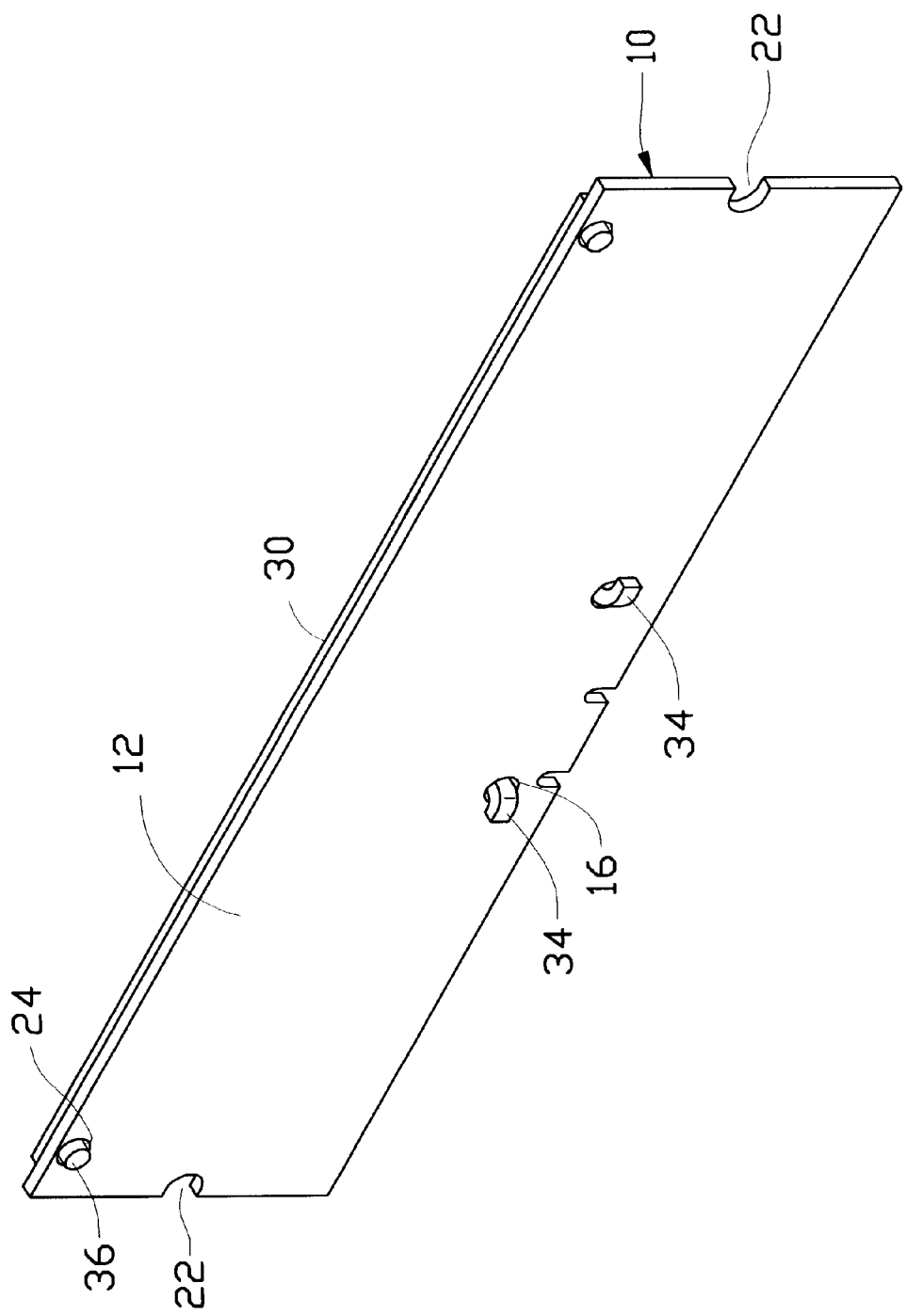
FIG. 3 is a rear perspective view of the memory module.

Also referring to FIGS. 2A and 2B, the casing 30 which is preferably a stamped aluminum alloy member comprises a flat plate 32 for mating with the face of the circuit board 12. A pair of latching arms 34 and a pair of positioning pins 36 are formed on the plate 32 respectively corresponding to and received in the latching holes 16 and the positioning holes 24 of the circuit board 12. The positioning pins 36 are received in the positioning holes 24 for properly positioning the casing 30 with respect to the circuit board 12. The latching arms 34 are resilient and have bent sections engaging with the latching holes 16 (FIG. 3) for securing the casing 30 to the circuit board 12.

The casing 30 forms a raised portion 33 of a predetermined first height on the plate 32 for defining a space to accommodate the memory chips 14 and the related electronic elements of the circuit board 12 thereby shielding the memory chips 14 and the related electronic elements from external electromagnetic interference. A recess 37 is formed in the raised portion 33 substantially corresponding in position to the memory chips 14. The recess 37 has a second height measured from the plate 32 which is less than the first height of the raised portion 33. The second height substantially corresponds to the height of the memory chips 14 whereby a bottom surface of the recess 37 contacts the memory chips 14 for conducting and removing heat generated by the memory chips 14 therefrom. Ventilation holes 39 are defined in the raised portion 33 for facilitating heat removal.

The casing 30 is anodized for corrosion resistance and surface finishing. Two non-anodized areas 42 are preserved on an inside face of the plate 32 which correspond to and physically engage two limbs of the U-shaped conductive trace 26 of the circuit board 12 whereby electrical engagement is formed between the non-anodized areas 42 and the conductive trace 26 for grounding the casing 30. A further non-anodized area 35 of the plate 32 is formed adjacent to each latching arm 34 and engages the corresponding conductive pad 18 of the circuit board 12 for grounding purposes.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A memory module comprising:
   a circuit board on which memory chips are mounted, a plurality of latching holes being defined on the circuit board; and a shielding casing comprising a flat plate mated with a face of the circuit board and a plurality of latching arms engaged with latching holes defined in the circuit board, thereby attaching the casing to the circuit board, the shielding casing forming a raised portion for defining a space to accommodate the memory chips therein, a recess being formed in the raised portion with a bottom surface thereof contacting the memory chips.

2. The memory module as claimed in claim 1, wherein at least one conductive grounding member is formed on the circuit board, the casing having a portion physically engaging with the grounding member of the circuit board for grounding the casing.

3. The memory module as claimed in claim 2, wherein the casing comprises an anodized metal member having a non-anodized portion for physically engaging the grounding member of the circuit board.

4. The memory module as claimed in claim 2, wherein the grounding member comprises a U-shaped conductive trace formed on the circuit board, the casing having two spaced portions engaging with corresponding limbs of the U-shaped conductive trace.

5. The memory module as claimed in claim 1, wherein the casing comprises two latching arms respectively engaging with two latching holes defined in the circuit board for securing the casing to the circuit board.

6. The memory module as claimed in claim 5, wherein a conductive grounding pad is formed on the circuit board around each latching hole, the casing having a portion adjacent to each latching arm for physically engaging with the corresponding grounding pad to ground the casing.

7. The memory module as claimed in claim 1, wherein ventilation holes are defined in the raised portion of the casing.

8. The memory module as claimed in claim 1, wherein the casing forms positioning pins thereon for insertion into corresponding positioning holes defined in the circuit board to properly position the casing with respect to the circuit board.

9. The memory module as claimed in claim 1, wherein the latching arms are stamped on the casing and comprise bent sections for engaging with the latching holes of the circuit board.

10. The memory module as claimed in claim 1, wherein the memory module is a RAM bus module.

11. A memory module comprising:

a circuit board on which a plurality of memory chips are mounted; and a shielding casing having a similar planar dimension with the circuit board and attached thereto, and defining a raised portion enclosing therein said memory chips; wherein a bottom surface of the shielding casing contacts the chips for heat transfer consideration.

12. The memory module as claimed in claim 11, wherein a recess portion is formed in said raised portion, said raised portion defining a first height away from the circuit board, said recess defining a second height away from the circuit board, said second height being smaller than said first height.

13. The memory module as claimed in claim 12, wherein said bottom surface is formed on said recess portion.

* * * * *